US011527511B2

(12) United States Patent
Gani et al.

(10) Patent No.: US 11,527,511 B2
(45) Date of Patent: Dec. 13, 2022

(54) ELECTRONIC DEVICE COMPRISING A SUPPORT SUBSTRATE AND STACKED ELECTRONIC CHIPS

(71) Applicants: STMicroelectronics Pte Ltd, Singapore (SG); STMicroelectronics (Grenoble 2) SAS, Grenoble (FR)

(72) Inventors: David Gani, Singapore (SG); Jean-Michel Riviere, Froges (FR)

(73) Assignees: STMicroelectronics Pte Ltd, Singapore (SG); STMicroelectronics (Grenoble 2) SAS, Grenoble (FR)

(*) Notice: Subject to any disclaimer, the term of this patent is extended or adjusted under 35 U.S.C. 154(b) by 315 days.

(21) Appl. No.: 16/692,720

(22) Filed: Nov. 22, 2019

(65) Prior Publication Data

US 2020/0168582 A1 May 28, 2020

(30) Foreign Application Priority Data

Nov. 28, 2018 (FR) ...................... 1872005

(51) Int. Cl.
*H01L 25/065* (2006.01)
*H01L 23/48* (2006.01)
*H01L 23/498* (2006.01)
*H01L 23/528* (2006.01)

(52) U.S. Cl.
CPC ........ *H01L 25/0657* (2013.01); *H01L 23/481* (2013.01); *H01L 23/49816* (2013.01); *H01L 23/528* (2013.01); *H01L 25/0652* (2013.01); *H01L 2225/06513* (2013.01); *H01L 2225/06517* (2013.01); *H01L 2225/06555* (2013.01)

(58) Field of Classification Search
CPC . H01L 25/043; H01L 25/0657; H01L 25/074; H01L 25/0756; H01L 25/117
See application file for complete search history.

(56) References Cited

U.S. PATENT DOCUMENTS

| 8,039,939 B2* | 10/2011 | Hwang | H01L 23/49833 |
| | | | 257/680 |
| 9,236,319 B2* | 1/2016 | Ha | H01L 25/0657 |
| 10,242,968 B2* | 3/2019 | Das | H01L 24/16 |
| 11,063,013 B2* | 7/2021 | Chen | H01L 25/105 |
| 2008/0164605 A1* | 7/2008 | Wu | H01L 24/17 |
| | | | 257/E23.079 |

(Continued)

FOREIGN PATENT DOCUMENTS

WO  2018063327 A1  4/2018

OTHER PUBLICATIONS

INPI Search Report and Written Opinion for FR 1872005 dated Sep. 10, 2019 (9 pages).

*Primary Examiner* — Mamadou L Diallo
(74) *Attorney, Agent, or Firm* — Crowe & Dunlevy

(57) ABSTRACT

An electronic device includes a support substrate to which a first electronic chip and a second electronic chip are mounted in a position situated on top of one another. First electrical connection elements are interposed between the first electronic chip and the support substrate. Second electrical connection elements are interposed between the second electronic chip and the support substrate and are situated at a distance from a periphery of the first electronic chip. Third electrical connection elements are interposed between the first electronic chip and the second electronic chip.

6 Claims, 4 Drawing Sheets

(56) References Cited

U.S. PATENT DOCUMENTS

| | | | |
|---|---|---|---|
| 2011/0175215 A1* | 7/2011 | Farooq | H01L 29/0657 |
| | | | 257/E23.141 |
| 2012/0018895 A1 | 1/2012 | Oganesian et al. | |
| 2013/0307094 A1* | 11/2013 | Yoshiuchi | G01P 1/023 |
| | | | 257/415 |
| 2014/0183723 A1 | 7/2014 | Ayotte et al. | |
| 2017/0179078 A1* | 6/2017 | Jung | H01L 25/0652 |
| 2019/0067180 A1* | 2/2019 | Auchere | H05K 1/185 |
| 2019/0067250 A1* | 2/2019 | Tojo | H01L 21/78 |
| 2019/0103362 A1* | 4/2019 | Lin | H01L 25/105 |
| 2019/0139915 A1* | 5/2019 | Dalmia | H01L 23/5383 |
| 2019/0198437 A1* | 6/2019 | Kim | H01L 23/49827 |
| 2019/0287945 A1* | 9/2019 | Tojo | H01L 25/50 |
| 2020/0098693 A1* | 3/2020 | Jeng | H01L 21/6835 |
| 2020/0105653 A1* | 4/2020 | Elsherbini | H01L 24/03 |
| 2021/0082876 A1* | 3/2021 | Ho | H03H 9/0576 |

* cited by examiner

ELECTRONIC DEVICE COMPRISING A SUPPORT SUBSTRATE AND STACKED ELECTRONIC CHIPS

PRIORITY CLAIM

This application claims the priority benefit of French Application for Patent No. 1872005, filed on Nov. 28, 2018, the content of which is hereby incorporated by reference in its entirety to the maximum extent allowable by law.

TECHNICAL FIELD

Embodiments of relate to electronic devices that comprise stacked electronic chips.

BACKGROUND

Known electronic devices comprise electronic chips that are adhesively bonded on top of one another and further bonded on top of a support substrate. The chips are offset from one another and are electrically connected to the support substrate by electrical connection wires. Such layouts exhibit difficulties when the wires are installed and drawbacks due in particular to the length of the wires, in which electrical losses occur and which are sensitive to mutual and surrounding electromagnetic effects.

SUMMARY

According to one embodiment, what is proposed is an electronic device that comprises: a support substrate having a front face, at least one first electronic chip situated on top of the support substrate and having a rear face at least partly facing the front face of the support substrate, at least one second electronic chip situated on top of the first chip and having a rear face, part of which rear face extends facing the front face of the first chip and part of which rear face extends beyond at least one edge of the periphery of the first chip and at least partly facing the front face of the support substrate, first electrical connection elements interposed between the first chip and the support substrate, and second electrical connection elements interposed between the first chip and the support substrate and situated at a distance from the periphery of the first chip.

Thus, the electrical links between the support substrate, the first chip and the second chip are able to be short and mechanically resistant, and the number of electrical links is able to be increased.

The electronic device may comprise third electrical connection elements interposed between the first chip and the second chip.

The rear face of the second chip may comprise a recess, and the first chip may be at least partly held in this recess and facing the bottom of this recess.

The electronic device may comprise third electrical connection elements interposed between the first chip and the bottom of the recess of the second chip.

The first chip may comprise a base layer and, on one side of this base layer, a substrate layer including an array of electrical connections.

The array of electrical connections of the first chip may be connected to the support substrate by way of the first electrical connection elements.

The array of electrical connections of the first chip may be connected to third electrical connection elements interposed between the first chip and the second chip.

The base layer of the first chip may be provided with a plurality of electrical connection through-vias.

The electrical connection through-vias of the first chip may be connected to the support substrate by way of the first electrical connection elements.

The electrical connection through-vias of the first chip may be connected to third electrical connection elements interposed between the first chip and the second chip.

The support substrate may comprise an array of electrical connections connected to the first and to the second electrical connection elements.

Said electrical connection elements may comprise balls, pillars or solder points.

BRIEF DESCRIPTION OF THE DRAWINGS

Electronic devices will now be described by way of non-limiting exemplary embodiments, illustrated by the appended drawing and in which.

DETAILED DESCRIPTION

Figure 1:
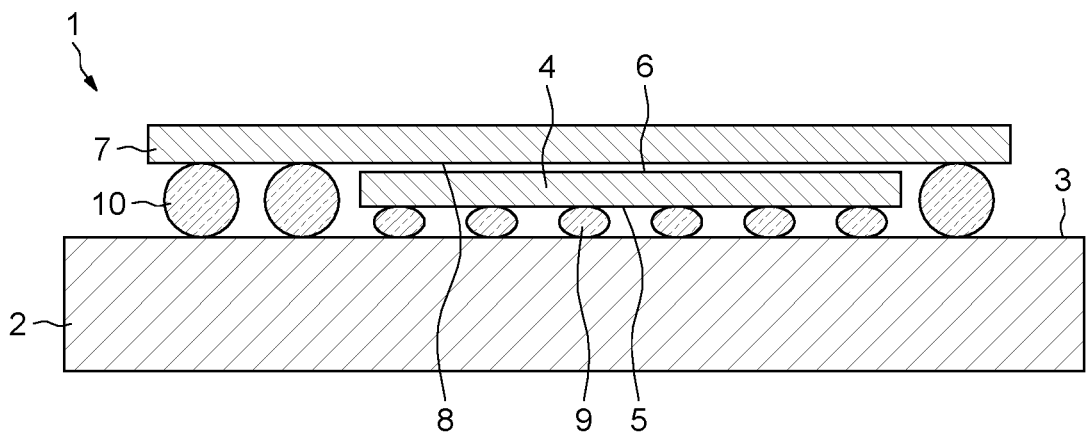
FIG. 1 shows a cross section of an electronic device.
Figure 2:
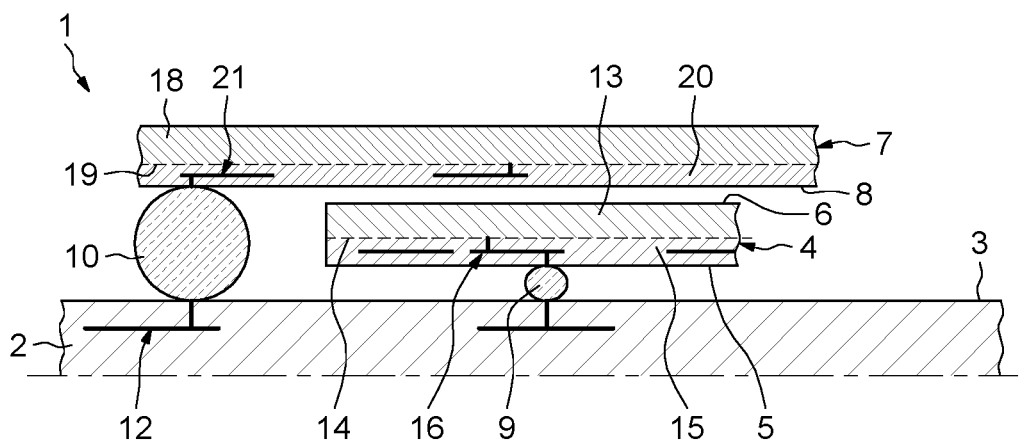
FIG. 2 shows an enlarged local cross section of the electronic device of FIG. 1.

An electronic device 1, illustrated in FIGS. 1 and 2, comprises a support substrate 2, in the form of a sheet, which has a front face 3, a first electronic chip 4 that is situated on top of the support substrate 2 and that has a rear face 5 facing the front face 3 of the support substrate 2 and a front face 6.

The electronic device 1 comprises a second electronic chip 7 that is situated on top of the first chip 4 and that has a rear face 8, part of which rear face extends facing the front face 6 of the first chip 4 and another part of which rear face extends beyond at least part of the periphery of the first chip 4 and facing the front face 3 of the support substrate 2, so as to form a specific stack.

The electronic device 1 further comprises first electrical connection elements 9, which are interposed between (that is to say situated between) the support substrate 2 and the first chip 4, and second electrical connection elements 10, which are interposed between (that is to say situated between) the support substrate 2 and the second chip 7 and which are situated at a distance from the periphery of the first chip 4.

The electrical connection elements 9 may be formed, for example, by balls or soldered pillars, and the electrical connection elements 10 may be formed by balls, soldered pillars or solder points, so as to form rigid direct electrical connections.

As illustrated more explicitly in FIG. 2, the support substrate 2 is provided with an array of electrical connections 12 that has front pads to which the first and second electrical connection elements 9 and 10 are electrically connected.

The first chip 4 comprises a base board (substrate) 13, for example made of silicon, which has a face 14 on which electronic components (not shown) are formed, and an interconnection layer 15 that is formed over the face 14 and that includes an array of electrical connections 16.

For example and advantageously, the interconnection layer 15 is situated on the side of the support substrate 2.

The array of electrical connections 16 of the first chip 4 has pads to which the first electrical connection elements 9 are electrically connected.

The second chip 7 comprises a base board (substrate) 18, for example made of silicon, which has a face 19 on which electronic components (not shown) are formed, and comprises an interconnection layer 20 that is formed over the face 19 and that includes an array of electrical connections 21. For example, the base board 18 is situated on the side opposite the support substrate 2. For example, the layer 19 is situated on the side with part facing the substrate 2 and part facing the first chip 4.

The array of electrical connections 21 has rear pads to which the second electrical connection elements 10 are electrically connected.

The first and second electrical connection elements 9 and 10 are sized such that the front and rear faces 6 and 8 of the chips 4 and 7 are in contact or a small distance apart from one another. A paste or an adhesive, made from a heat-conducting material, may optionally be inserted between the front and rear faces 6 and 8 of the chips 4 and 7.

By virtue of the assembly described above, the chips 4 and 7 are electrically connected to the array of electrical connections 12 of the support substrate 2, by way of the first and second electrical connection elements 9 and 10, respectively, and are able to be connected to one another by way of this array of electrical connections 12.

Figure 3:
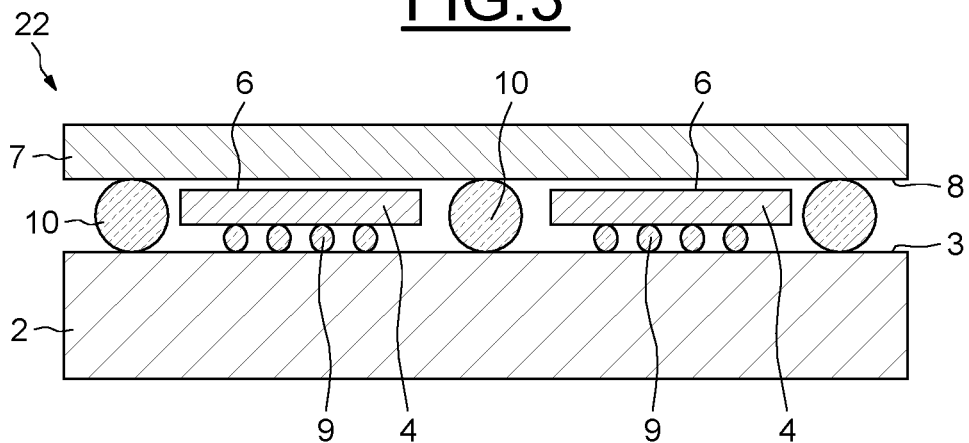
FIG. 3 shows a cross section of another electronic device.

An electronic device 22 illustrated in FIG. 3 is distinguished from the electronic device 1 described with reference to FIGS. 1 and 2 in that it comprises a plurality of first electronic chips 4 situated between the support substrate 2 and the second chip 7 and at a distance from one another, for example.

The first chips 4 are electrically connected to the support substrate 2 in a manner equivalent to the mounting of the first chip 4 of the electronic device 1 described above, by first and second electrical connection elements 9 and 10.

In this case, for example, some of the second electrical connection elements 10 connecting the support substrate 2 and the second chip 7 may advantageously be situated in the spaces between the first chips 4.

Figure 4:
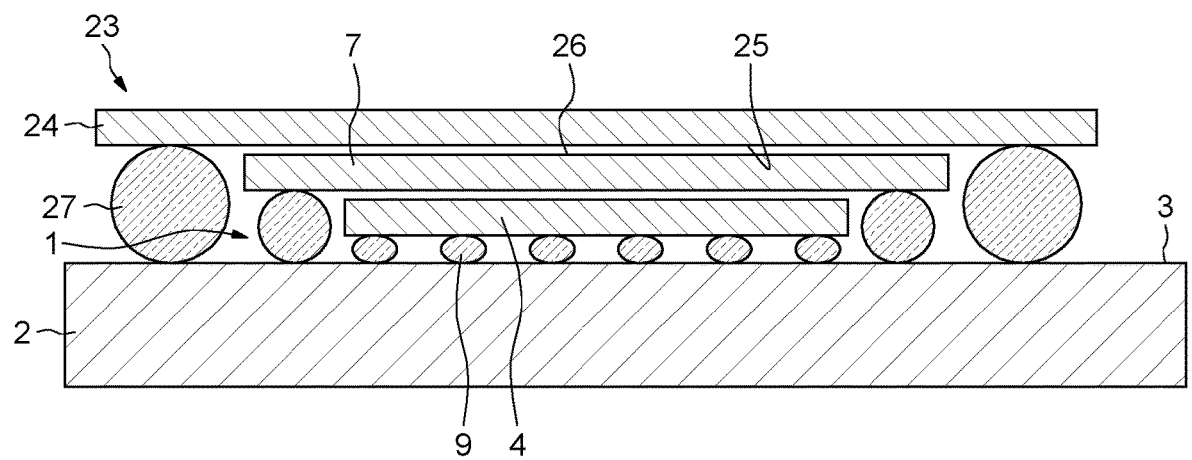
FIG. 4 shows a cross section of another electronic device.

An electronic device 23 illustrated in FIG. 4 comprises the electronic device 1 described with reference to FIGS. 1 and 2 and furthermore comprises a third electronic chip 24 that is situated on top of the second chip 7 and that has a rear face 25, part of which rear face extends facing a front face 26 of the second chip 7 and another part of which rear face extends beyond at least part of the periphery of the first and second chips 4 and 7 and facing the front face 3 of the support substrate 2, so as to form another specific stack.

Furthermore, the electronic device 22 comprises additional electrical connection elements 27 that are interposed between (that is to say situated between) the support substrate 2 and the third chip 7 and that are situated at a distance from the periphery of the first and second chips 4 and 7. The electrical connection elements 27 connect the electrical connection array of the support substrate 2 and an electrical connection array of the third chip 24.

Figure 5:
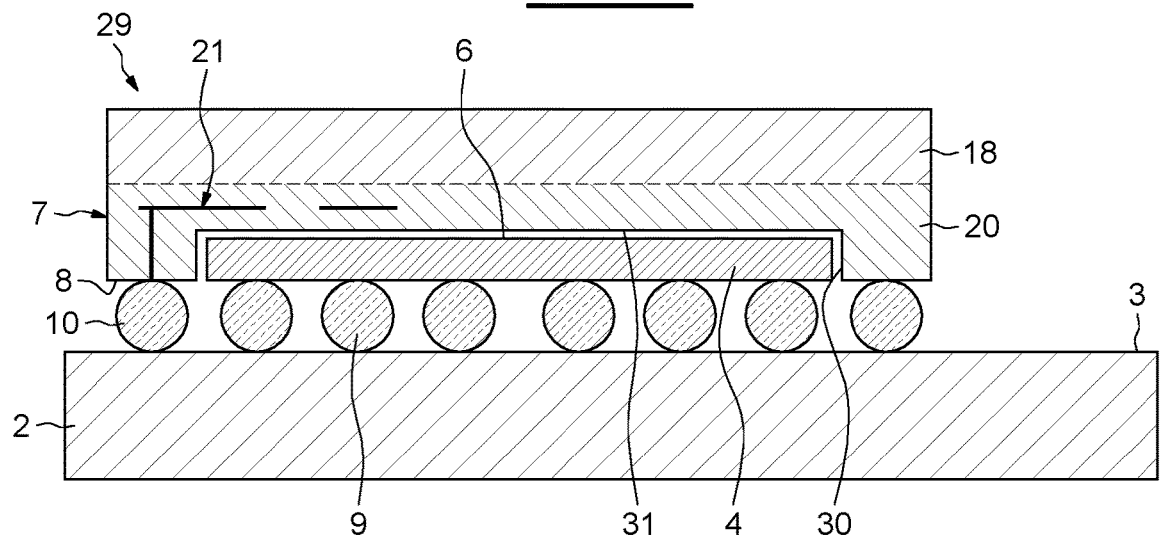
FIG. 5 shows a cross section of another electronic device.

An electronic device 29 illustrated in FIG. 5 is distinguished from the electronic device 1 described with reference to FIGS. 1 and 2 in that the rear face 8 of the second electronic chip 7 comprises a recess 30 in which the first chip 4 is at least partly held.

Advantageously, the recess 30 is formed in the layer 20 of the second chip 7.

The front face 6 of the chip 4 may be in contact or at a small distance from the bottom 31 of the recess 30. A layer made of a heat-conducting material may optionally be inserted between the front face 6 of the chip 4 and the bottom 31 of the recess 30.

The thickness of the stack formed by the chips 4 and 7 is thus able to be reduced.

Of course, a plurality of first chips may be installed in a recess of the second chip, and a plurality of recesses of the second chip may be provided in order to receive at least one first chip.

Figure 6:
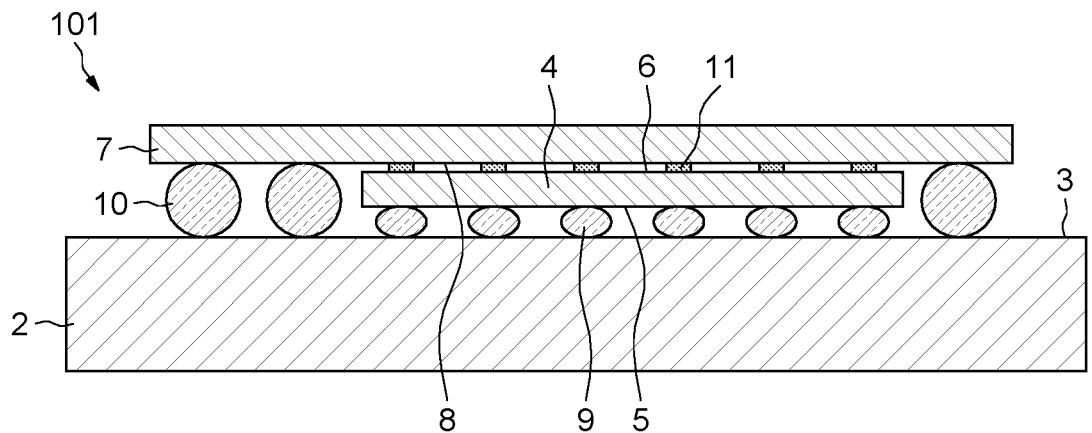
FIG. 6 shows a cross section of a variant embodiment of the electronic device of FIG. 1.
Figure 7:
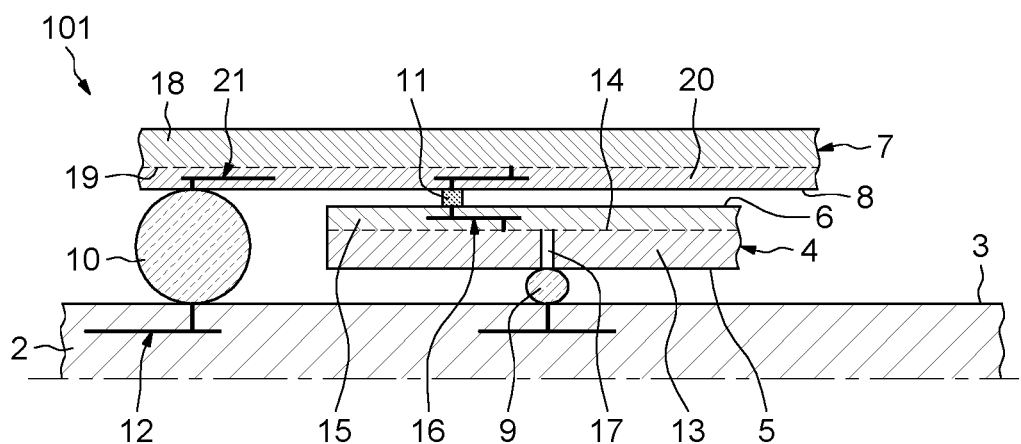
FIG. 7 shows an enlarged local cross section of the electronic device of FIG. 6.

An electronic device 101 of FIGS. 6-7 is distinguished from the electronic device 1 described with reference to FIGS. 1 and 2 in that it further comprises third electrical connection elements 11 that are interposed between (that is to say situated between) the first chip 4 and the second chip 7.

The third electrical connection elements 11 may be formed by balls, pillars or solder points.

As illustrated in FIG. 7, the chip 4 is flipped with respect to its layout illustrated in FIG. 2, such that the base board 13 is on the side of the support substrate 2 and that the interconnection layer 15, including the array of electrical connections 16, is on the side of the second chip 7.

Moreover, the base board 13 of the first chip 4 is provided, in through-holes, with electrical connection vias 17 (TSV) that are connected to the electronic components of the first chip 4 and/or to the array of electrical connections 16, on the one hand, and have rear pads to which the first electrical connection elements 9 are electrically connected, on the other hand.

Furthermore, the array of electrical connections 16 of the first chip 4 has front pads to which the third electrical connection elements 11 are electrically connected, on the one hand, and the array of electrical connections 21 of the second chip 7 has rear pads to which the second electrical connection elements 11 are electrically connected, on the other hand.

Thus, in addition to the electrical links by way of the first and second electrical connection elements 9 and 10 described above, the chips 4 and 7 are also connected directly to one another by way of the third electrical connection elements 11.

Figure 8:
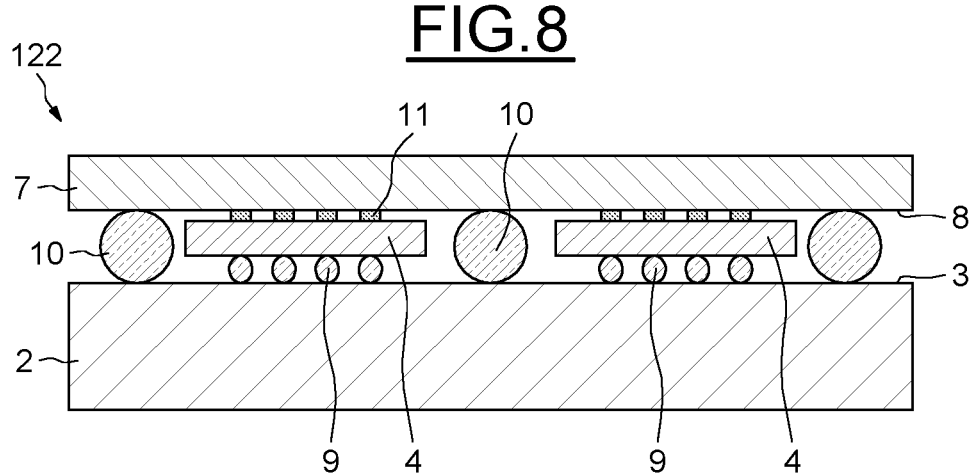
FIG. 8 shows a cross section of a variant embodiment of the electronic device of FIG. 3.

An electronic device 122 illustrated in FIG. 8 is distinguished from the electronic device 22 described above with reference to FIG. 3 in that it further comprises third electrical connection elements 11 interposed between the first chips 4 and the second chip 7 and electrically connected to the first chips 4 and to the second chip 7 in a manner equivalent to what has just been described with reference to FIG. 7.

Figure 9:
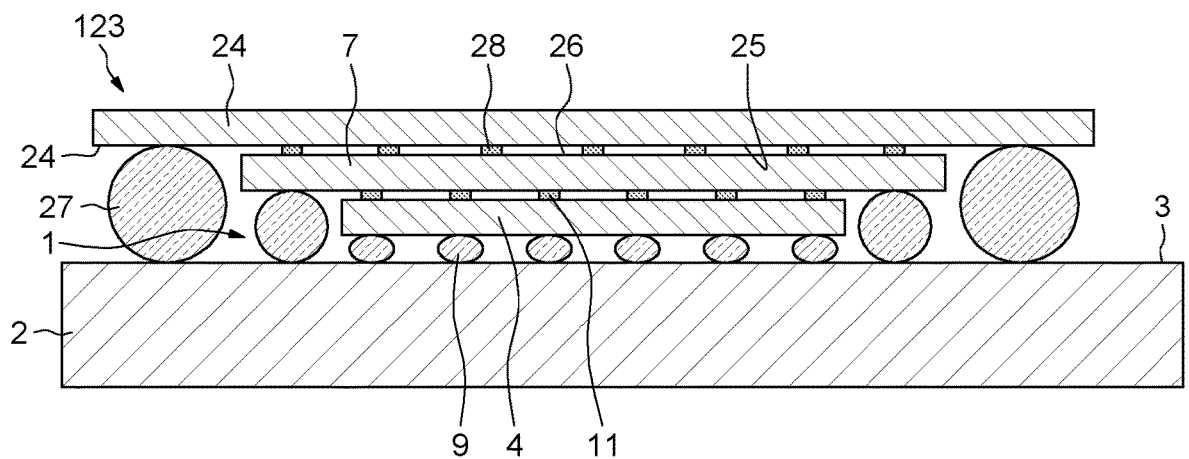
FIG. 9 shows a cross section of a variant embodiment of the electronic device of FIG. 4.

An electronic device 123 illustrated in FIG. 9 is distinguished from the electronic device 23 described above with reference to FIG. 4 in that it further comprises third electrical connection elements 11 interposed between the first chip 4 and the second chip 7 and additional electrical connection elements 28 interposed between the second chip 7 and the third chip 24.

The third electrical connection elements 11 electrically connect the first chip 4 and the second chip 7 in a manner equivalent to what has just been described with reference to FIG. 7.

Moreover, the second chip 7 is provided with an array of electrical connections and of electrical connection vias, in a manner equivalent to the chip 4, so as to form direct electrical connections between the second chip 7 and the third chip 24.

Figure 10:
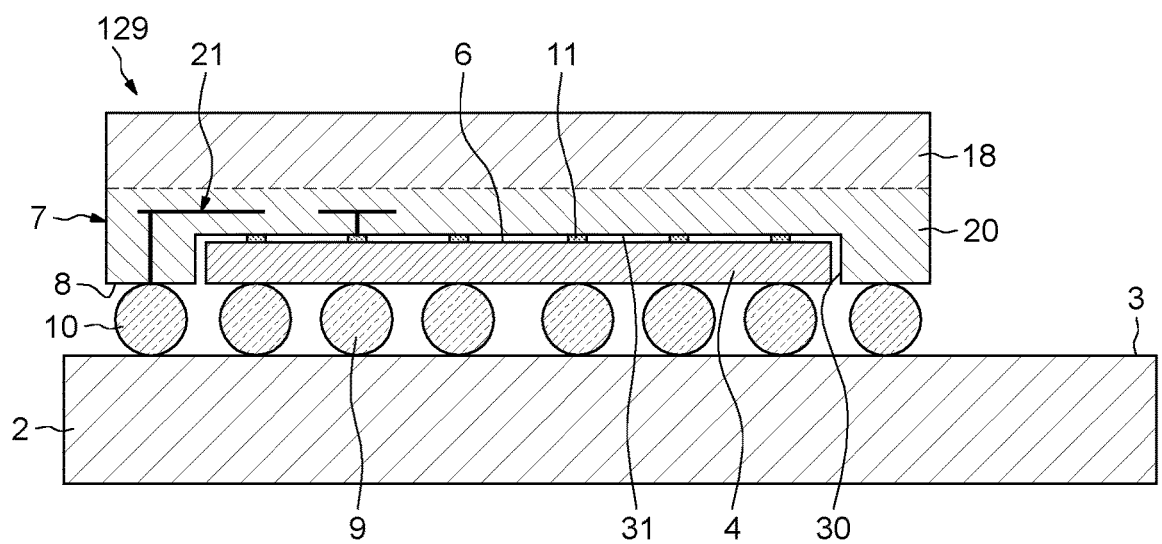
FIG. 10 shows a cross section of a variant embodiment of the electronic device of FIG. 5.

An electronic device 129 illustrated in FIG. 10 is distinguished from the electronic device 29 described above with reference to FIG. 5 in that it further comprises third electrical connection elements 11 interposed between the first chip 4 and the bottom 31 of the recess 30.

The array of electrical connections 21 contained in the layer 20 of the second chip 7 has pads arranged on the bottom 31 of the recess 30 and to which the third electrical connection elements 11 are electrically connected so as to form direct links between the first chip 4 and the second chip 7.

The invention claimed is:

1. An electronic device, comprising:
a support substrate having a front face;
a first electronic chip positioned over the front face of the support substrate, said first electronic chip including a first semiconductor substrate with first electronic circuits and a first interconnection layer with a first interconnect network connected to the first electronic circuits;
wherein the first interconnection layer faces the front face of the support substrate;
first electrical connection elements interposed between the first interconnect network of the first interconnection layer and the front face of the support substrate;
a second electronic chip positioned over the front face of the support substrate, said second electronic chip including a second semiconductor substrate with second electronic circuits and a second interconnection layer with a second interconnect network connected to the second electronic circuits;
wherein a first part of the second interconnection layer includes a recess within which a portion of the first electronic chip is positioned and wherein a second part of the second interconnection layer extends beyond a peripheral edge of the first electronic chip and faces the front face of the support substrate; and
second electrical connection elements interposed between the second interconnect network of the second interconnection layer and the front face of the support substrate, said second electrical connection elements situated at a distance from the peripheral edge of the first electronic chip.

2. The device of claim 1, further including third electrical connection elements interposed between the first semiconductor substrate of the first electronic chip and the second part of the second interconnection layer.

3. The device of claim 2, wherein the first semiconductor substrate of the first electronic chip includes through silicon vias that are electrically connected to the third electrical connection elements.

4. An electronic device, comprising:
a support substrate having a front face;
a first electronic chip positioned over the front face of the support substrate, said first electronic chip including a first semiconductor substrate with first electronic circuits and a first interconnection layer with a first interconnect network connected to the first electronic circuits;
wherein the first semiconductor substrate faces the front face of the support substrate;
first electrical connection elements interposed between the first semiconductor substrate and the front face of the support substrate;
a second electronic chip positioned over the front face of the support substrate, said second electronic chip including a second semiconductor substrate with second electronic circuits and a second interconnection layer with a second interconnect network connected to the second electronic circuits;
wherein a first part of the second interconnection layer includes a recess within which a portion of the first electronic chip is positioned and wherein a second part of the second interconnection layer extends beyond a peripheral edge of the first electronic chip and faces the front face of the support substrate; and
second electrical connection elements interposed between the second interconnect network of the second interconnection layer and the front face of the support substrate, said second electrical connection elements situated at a distance from the peripheral edge of the first electronic chip.

5. The device of claim 4, further including third electrical connection elements interposed between the first interconnection layer of the first electronic chip and the second part of the second interconnection layer.

6. The device of claim 5, wherein the first semiconductor substrate of the first electronic chip includes through silicon vias that are electrically connected to the first electrical connection elements.

* * * * *